United States Patent [19]

Charbonnier

[11] Patent Number: 4,862,110
[45] Date of Patent: Aug. 29, 1989

[54] OSCILLATOR, IN PARTICULAR A SURFACE ACOUSTIC WAVE OSCILLATOR, FREQUENCY CONTROLLED BY CONTROLLING ITS TEMPERATURE

[75] Inventor: Roger Charbonnier, Meudon Bellevue, France

[73] Assignee: Schlumberger Industries, France

[21] Appl. No.: 190,988

[22] Filed: May 6, 1988

[30] Foreign Application Priority Data

Feb. 18, 1988 [FR] France ................ 88 01925

[51] Int. Cl.⁴ .............................. H03B 1/00
[52] U.S. Cl. ............................ 331/70; 333/155
[58] Field of Search .......... 331/1 A, 25, 70, 175, 331/176, 177 R, 187; 333/152, 155; 310/313 R, 315, 341, 346

[56] References Cited

PUBLICATIONS

White et al., Stabilising Surface–Wave Devices Against Temperature Variations, Electronic Letters, Mar. 23, 1972, vol. 8, No. 6, pp. 142–143.

Primary Examiner—Eugene R. LaRoche
Assistant Examiner—Robert J. Pascal
Attorney, Agent, or Firm—William A. Drucker

[57] ABSTRACT

An oscillator is provided, in particular a surface acoustic wave oscillator, frequency controlled by controlling its temperature, which oscillator comprises a SAW resonator frequency controlled by an integral loop including a heating means coupled thermally to the resonator and by two electric respectively proportional and semi-integral loops.

10 Claims, 3 Drawing Sheets

FIG. 2
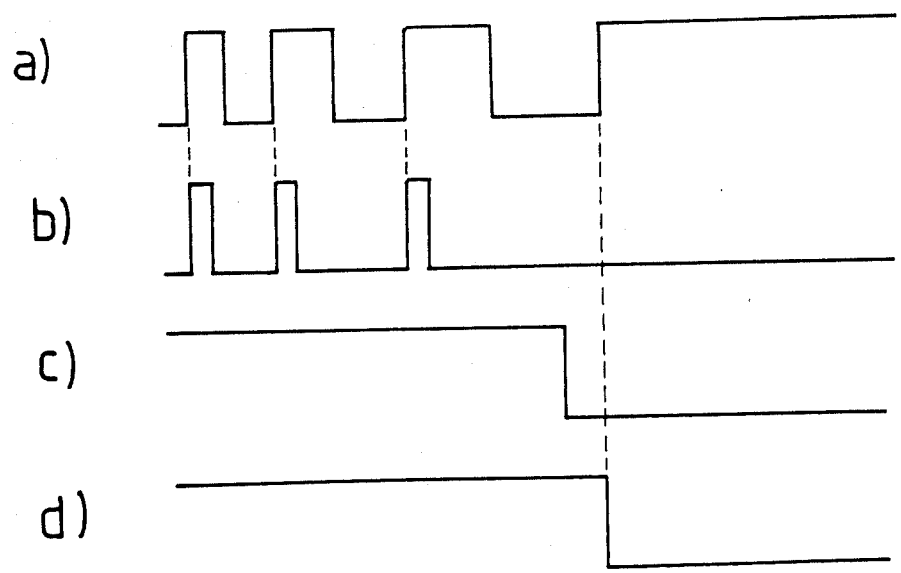
a)
b)
c)
d)
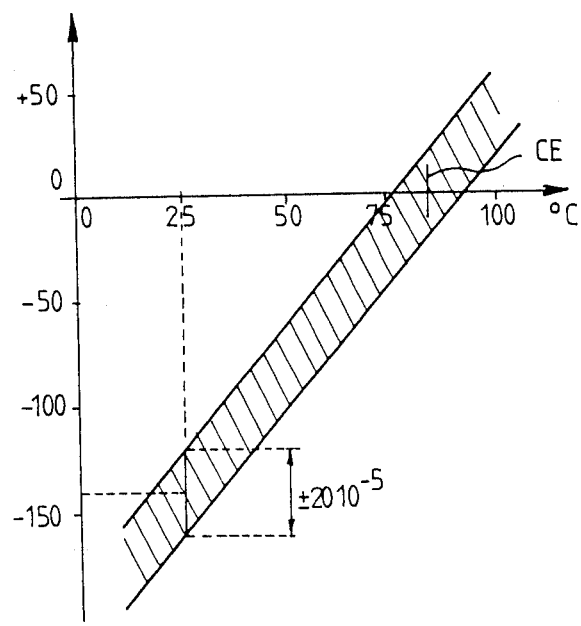
FIG. 3

OSCILLATOR, IN PARTICULAR A SURFACE ACOUSTIC WAVE OSCILLATOR, FREQUENCY CONTROLLED BY CONTROLLING ITS TEMPERATURE

BACKGROUND OF THE INVENTION

1. Field of the Invention

The invention relates more particularly to electric oscillators of the type comprising a surface wave resonator also known as "SAW".

These oscillators have at least one SAW resonator with two pairs of interdigitated electrodes mounted on a substrate, very often of quartz, between which surface acoustic waves are propagated and an active circuit connected to said electrodes.

SAW oscillators have numerous ultra high frequency applications and have the advantage of high spectral purity. For example, in the frequency range between 100 and 1000 MHz, they give a phase noise gain of more than 20 dB with respect to volume wave quartz oscillators.

The problem solved by the invention is that of the frequency setting of an oscillator and more particularly of a SAW oscillator.

The frequency of a SAW depends on a number of dimensional factors (in particular the distance between the adjacent fingers of the interdigitated electrodes and on the elastic constants of the substrate.

The initial frequency setting of the SAW at a reference temperature depends on the dimensional accuracy of a mask ruled with a large number of lines, all the more since the quality factor (overvoltage due to resonance) of the SAW is high. Moreover, the subsidiary electric setting which can be provided by the circuit of the oscillator is substantially less than the frequency dispersion of the SAW and provides a correction all the poorer the higher the quality factor.

The result is finally that a SAW resonator is, by construction, imprecise in frequency and all the less adjustable by electric control as its quality factor is high, apart from resorting to sorting out which results in an unacceptable wastage rate.

By way of example, a 200 MHz SAW resonator with an overvoltage of 30,000 is, by construction, imprecise to ±20 Kz, whereas its electric resetting is only ±10 KHz. To that must be added a longterm drift of ±5 KHz per year and a temperature coefficient, because the temperature affects not only the dimensional factors but also the elastic constants of the substrate.

To avoid having to place the SAW in a thermostatic enclosure, it has already been proposed to minimize its proper temperature coefficient, either by using particular crystallographic cut of the substrate, (see for example U.S. Pat. Nos. 4,400,640, 4,602,182 and 4,609,843), or by a particular construction of the substrate (U.S. Pat. No. 4,622,855), or by associating several SAWs to provide mutual temperature compensation (FRA No. 2 392 538). Different electric circuits have also been proposed servo-controlled to the temperature of the substrate and adapted for controlling the frequency thereof within the possible resetting range (U.S. Pat. Nos. 4,491,931, 4,489,289).

SUMMARY OF THE INVENTION

The invention provides an oscillator having a resonator, an active circuit for energizing said resonator and means for setting the output frequency from a reference frequency, wherein said means include a heating member thermally coupled to the resonator and at least one servocontrol loop controlling the heating member as a function of the difference between the output frequency of the oscillator and a reference frequency. In a preferred embodiment, said servocontrol loop (thermal setting loop) forms an integral control loop which provides the frequency approach and is associated with at least one traditional electric setting loop which provides the fine frequency setting, the thermal setting loop making the temperature dependent on a value such that the resultant frequency is brought into the lock-on range of the electric setting loop.

In a particularly advantageous embodiment, the electric setting uses at least one semi-integral control loop.

Although the invention relates more particularly to SAW oscillators it will be noted that it can also be applied to traditional volume wave oscillators when the characteristics of the resonator are such that pure electric setting cannot readily provide a frequency setting of the oscillator which corresponds to a round number.

BRIEF DESCRIPTION OF THE DRWINGS

Other features, as well as the advantages of the invention will be clear from the following description.

In the accompanying drawings:

FIG. 2 shows the wave forms at different points of the diagram;

FIG. 3 illustrates the frequency dispersion of a 200 MHz SAW resonator used in the oscillators of the invention.

MORE DETAILED DESCRIPTION OF THE PREFERRED EMBODIMENT OF THE INVENTION

Figure 1:
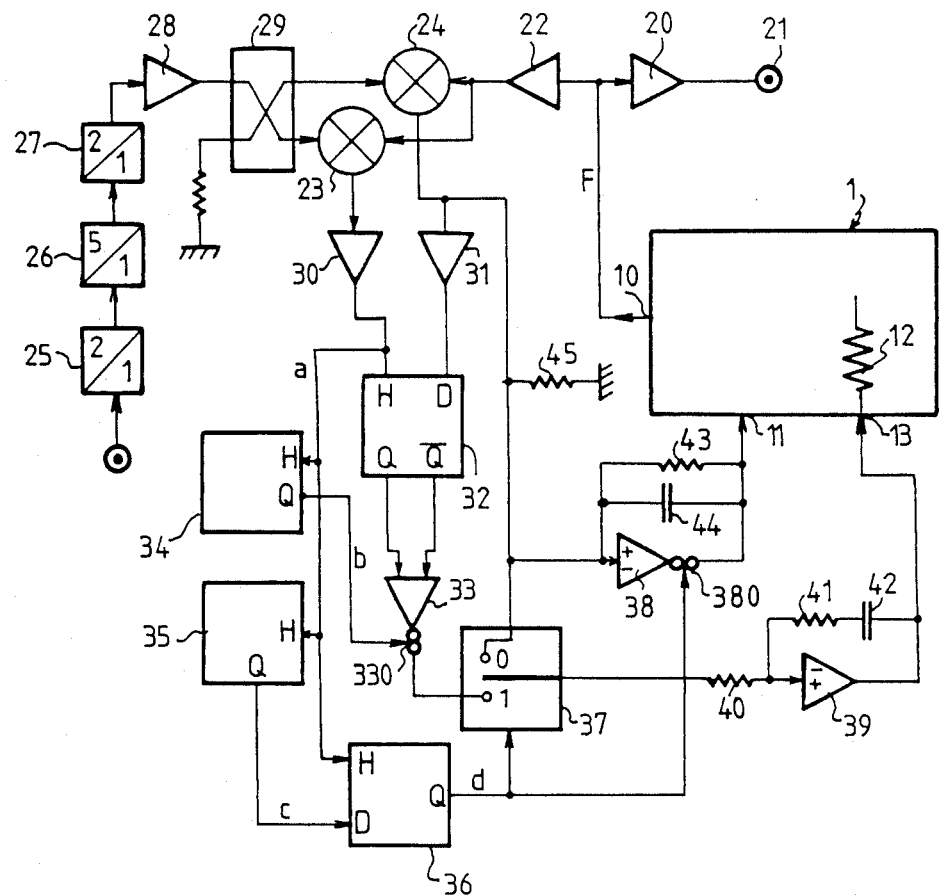
FIG. 1 is the general diagram of a SAW oscillator according to a preferred embodiment of the invention.
Figure 4:
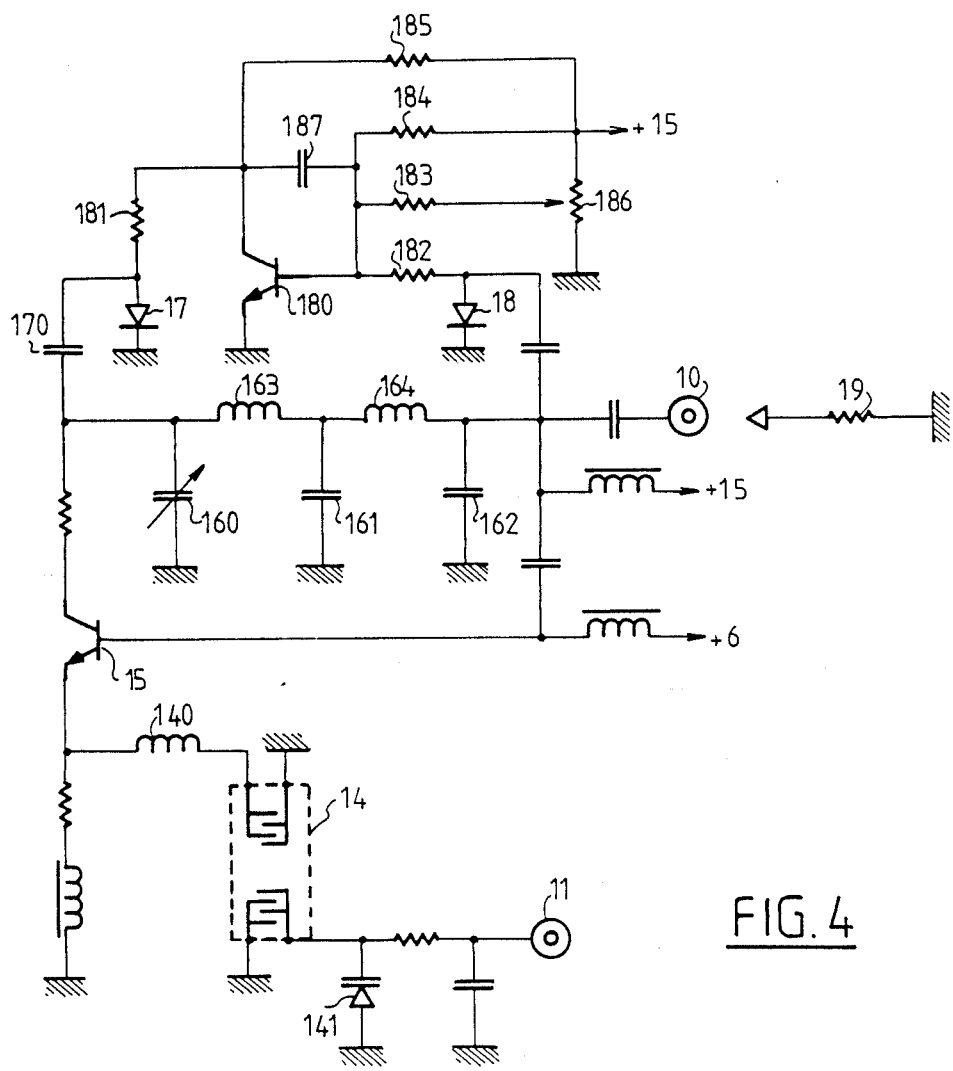
FIG. 4 illustrates a preferred circuit of the SAW oscillator.

FIG. 1, oscillator 1, which may be of a type known per se, has an output 10, a terminal 11 for the electric control of its frequency F and an electric heating means shown symbolically by a resistance 12, connected to a terminal 13 controlling the current which flows therethrough. FIG. 4 illustrates, by way of non limitative example, a SAW oscillator circuit to which the invention applies.

Preferably, the heating means is advantageously a power transistor bonded to the case of the resonator and whose heat dissipation is linear as a function of the control current, which makes it possible to determine approximately the value of the heat transfer time constant (a resistive system, which would dissipate a power which is a quadratic function of the control signal, would not make it possible to define a gain of the servo control loop).

The frequency signal F is amplified at 20 and fed to output 21 of the circuit and is applied through an amplifier 22 to a first input of two doubly balanced mixers 23–24, which may advantageously be of the "phase detector" type with staggered impedances (for example 50 ohms for the ports LO and RF, 500 ohms for the port IF).

By way of example, the components of the family RPD commercialized by "Microcircuit Laboratories" may be used.

The two inputs of these mixers are driven in quadrature by a frequency of 200 MHz, obtained for example by low noise multiplication in a chain formed, in the example described, of 3 multipliers 25-26-27 with respective multiplication factors 2, 5 and 2, of a reference frequency taken here equal to 10 MHz.

The output of the multiplication chain drives the mixers through an amplifier 28 and a hybrid coupler 29 of the 90°/3 dB type.

Depending on the sign of the frequency error $\Delta F$ between F and the 200 MHz reference, the output sinusoids of one of the mixers are advanced or delayed in phase by a quarter of a period with respect to those of the other.

Two hysteresis comparators 30, 31 clip said sinusoids so as to form them into square waves which are applied respectively to the inputs H and $\overline{D}$ of a flip flop 32. This latter then generates, at its Q and $\overline{Q}$ outputs. logic levels 1 or 0 depending on said sign.

A transconductance operational amplifier 33 is connected by its inputs to the Q and $\overline{Q}$ outputs and delivers when it is enabled by brief square waves of constant duration and amplitude and of a frequency proportional to $\Delta F$ applied at its terminal 330, a means current proportional to $\Delta F$, whose flow direction depends on the sign of the error.

These brief square waves (wave form b, FIG. 2), are generated at the Q output of a univibrator 34 which receives at its input H the output square wave of comparator 30 (wave form a, FIG. 2).

The signal a is representative of the difference between the frequency F and the 200 MHz reference, i.e. its period is inversely proportional to $\Delta F$.

The signal a is further applied to the input H of a second univibrator 35 and to the input H of a flip-flop 36.

In a so called frequency approach step of the servocontrol ($\phi A$, FIG. 2), $\Delta F$ is relatively large and the time constant for retripping the univibrator 35 was chosen so that it is permanently retriped (wave form c, FIG. 2). The result is that the Q output of flip-flop 36 (signal d FIG. 2) is then constantly positioned at logic level 1.

On the other hand, when $1/\Delta F$ becomes greater than the natural period of the univibrator 35, the Q output of the flip-flop passes to level 0 (final step $\phi F$ of the servocontrol, FIG. 2).

Furthermore, the univibrator 34 ceases to be retripped.

During the frequency approach step, the square waves b from the univibrator 34 enable the amplifier 33, whereas a controlled inverter 37 is placd in position 1 by the signal d.

During the final step, the signal d is at level 0, which places the inverter 37 in position 0.

If we now consider the mixer 24, it can be seen that its output is connected to the input of a transconductance operation amplifier 38 and to the input of an amplifier 39 through the inverter 37 when it is in position 0 and a resistor 40.

Amplifier 39 forms, with a resistor 41 and a capacitor 42 in series between its input and its output, and taking into account the thermal time constant of the heating means, part of a servo-control loop with integral control, ie. the output signal of 39 applied to terminal 13 is such that, related to the thermal true constant of the heating means, the assembly permanently delivers a substrate temperature which is a pure integral function of the correction voltage collected at the output of the inverter. The correction signal itself comes either from the approach amplifier 33, or from the mixer 24 and is itself a function of the instantaneous frequency error $\Delta F$. The pure integral function is obtained by connecting, to the terminals of amplifier 39, a dipole formed of a resistor 41 and a capacitor 42 mounted in series and defining a time constant equal to the thermal time constant of the heating means.

The input of 38 is connected to its output by a resistor 43 in parallel across a capacitor 44. A resistor 45 connects the output of mixer 24 to ground, so as to apply to the parallel circuit 43-44 a proportional control signal which will be directly transmitted to terminal 12 by this cirucit, when the amplifier 38 is disabled.

When it is enabled, amplifier 38, whose output is connected to terminal 12, forms, in cooperation with circuit 43-44, a part of a servo-control loop with semi-integral control.

The resonator included in oscillator 1 is initially set so as to generate, at ambient temperature, a frequency less or greater than the reference frequency, (i.e. the basic reference frequency multiplied by the multiplication factor of the chain 25-26-27) depending on the sign of the temperature coefficient, so that, as has already been explained, on energizing the device an error signal appears at the output of each of the mixers 23 and 24.

The integral control loop contributes to correcting the error $\Delta F$ by causing the heating means 11 to be brought into service. With the resonator having for example a positive temperature coefficient, the result is that the output frequency rises until it reaches a value such that the assembly of the two electric setting loops connected at 11 may come into step, so as to provide fine setting of the frequency to the reference value.

It will be noted that the true constant of the thermal setting loop is greater than several seconds. By way of example, this loop will have a cut off frequency at 3 dB of the order of 0.05 Hz. The proportional control loop has for example a high cut off frequency going up to 60 Hz, but with a low gain, whence the considerable practical advantage of the semi-integral control loop, which will for example cover the servocontrol band going from 0.1 to 10 Hz.

Th gain/frequency response curve of the servocontrol thus formed has finally optimal characteristics, both insofar as the phase noise is concerned and the stability of the servocontrol.

In operation, we have seen that during the frequency approach step of the servocontrol the signal d is at level 1, so that the inverter 37 is in position 1; it also follows that amplifier 38 is disabled by its control input 380, whereas 33 transmits to the circuit 39-42 a current proportional to $\Delta F$. In other words, the integral control loop is then in service and is fed by the mixer 23 through the univibrator 34, whereas the semiintegral loop is out of service.

The proportional control loop is in service through the univibrator 34, but its effect on the servocontrol is negligible During the final phase, the signal d is at level 0, so that the inverter 37 is in position 0 and amplifier 38 is enabled. The three loops are then in service and are fed directly by the mixer 24.

By way of example of application of the circuit, the resonator is a SAW initially set at 25° C. to 199.720 MHz ±20 KHz for generating a frequency of 200 MHz.

This SAW resonator, contrary to those of the prior art, which have generally a crystallographic section such that the temperature coefficient is minimized, has advantageously a Y cut (axis Y perpendicular to the substrate, axis X in the propagation direction, axis Z in the direction of the width of the substrate) chosen for conferring thereon a high temperature coefficient, which causes a monotonic variation of the frequency variation may be controlled by acting on the temperature to bring it back into the lock-on range of the electric setting loops.

By way of example, this coefficient will be of the order of $\pm 2.4 \cdot 10^{-5}/°$ C., so that, for F=200 MHz, the frequency variation will be 4.8 KHz/° C. A temperature variation of only $\pm 4°$ also compensates for the dispersion. FIG. 2 shows that, for the resonator defined in the example, the reference frequency is reached for temperatures between 75° and 92° C.

The vertical straight line segment CE shows that the possible electric setting range will be insufficient for along compensating for the dispersion.

A more thorough analysis of the circuit of FIG. 1 leads to the following remarks.

The problems of locking on the servocontrol in the approximation phase could be solved with a comparator of the phase-frequency type, which would appreciably simplify the circuit, where it is resolved by using the equivalent of a frequency discriminator with proportional output. This equivalent is formed by the phase detectors 23, 24 which, with a sign discriminator circuit formed, by way of example, of the flip-flop 32 controls the sign of the signal delivered by the transconductance amplifier 33, so as to bring the output signal of the oscillator into the lock-on range.

This solution is original since a phase detector is not along able to lock-on throughout a wide range. With respect to the solution using a phase comparator, it has the advantage of causing the integral control loop to operate not by all or nothing but with proportional output (which avoids any overshoot or oscillation).

Another advantage of the circuit described is that, with the exception of the multiplication chain 25-26-27, it operates entirely at the frequency F.

A phase-frequency comparator would necessarily operate at the basic reference frequency of 10 MHz, at least for the values of F of the order indicated, for which the known components of this type cannot operate at frequencies as high as 200 MHz. It would then be connected to the output of the oscillator through a frequency divider, and since these two elements would remain in service in the final servocontrol phase, they would generate a spectrum of lines at the basic reference frequency of 10 MHz, which would make it necessary to separate them topologically from the rest of the circuit. In the circuit described, only the multiplication chain must be separated, for in the final servocontrol phase, the logic circuts 30, 32, 34, 35 and 36 remain in a stable state. In fact, at the time of the transition from one phase to another, the output voltage of mixer 24 is close to 0, whereas that of 23 is maximum. Under these conditions no transition appears on the signal a.

A preferred embodiment of the oscillator 1 will now be described with reference to FIG. 4.

It comprises essentially a SAW resonator 14 used in reflection mode, the negative resistance sustaining the oscillations being formed by a transistor 15 and by a passive reaction network formed, in the embodiment described which is particularly suitable for frequencies between a few MHz and several hundreds of MHz, of two $\lambda/4$ line sections mounted in series, formed, so as to reduce the size thereof, in the HF/VHF/UHF fields, by $\pi$ cells formed of capacitors 160-161-162 and self inducatances 163-164.

The oscillator further comprises a load resistor which is variable as a function of the output level, connected to the input of the passive network by a capacitor 170 and formed by a PIN diode 17 itself controlled by a regulation circuit which controls the output level. This circuit comprises a diode for detecting the signal 18, a DC amplifying transistor 180, resistors 181 and 182-185 and 186 and a capacitor 187.

This control makes it possible to linearly adjust the overall current gain without modifying the 180° phase shift provided by the network.

The output circuit has been shown symbolically by a 50 ohm resistor 19. The case of resonator 14 is intimately coupled thermally to a power transistor, not shown, which forms the heating means and the assembly is placed in a thermally insulated enclosure, not shown, one wall of which has passing therethrough a self inductance 140 for connecting the resonator to the emitter of the transistor 15.

A variable capacity diode 141, controlled by the signal applied to terminal 11 (which corresponds to the one carrying the same reference number in FIG. 1) operates electrical frequency correction.

What is claimed is:

1. An oscillator having a resonator, an active circuit for energizing said resonator and means for setting the ouput frequency of the oscillator, said means including a heating member thermally coupled to the resonator and at least one servocontrol loop controlling the heating member as a function of the difference between said output frequency and a predetermined reference frequency.

2. The oscillator as claimed in claim 1, wherein said resonator is of the surface acoustic wave type.

3. The oscillator as claimed in claim 1, wherein said servocontrol loop is an integral control loop which provides an approach of the output frequency setting and is associated with at least one electric setting control means which provides a fine setting of said output frequency, the integral control loop setting the temperature of the resonator for bringing said output frequency into the lock-on range of the electric setting loop.

4. The oscillator as claimed in claim 3, wherein said electric setting control means includes at least one semi-integral control loop.

5. The oscillator as claimed in claim 4, wherein said electric setting control means further includes a proportional control loop.

6. The oscillator as claimed in claim 3, wherein said electric setting control means includes a first mixer to which said output frequency is directly applied.

7. The oscillator as claimed in claim 6, wherein said first mixer is a doubly balanced mixer of the phase detector type.

8. The oscillator as claimed in claim 7, wherein the integral control loop includes a frequency discriminator having an output signal proportional to the frequency.

9. The oscillator as claimed in claim 8, wherein said frenquency discriminator comprises : said first mixer; a second doubly balanced mixer driven in quadrature with said mixer, by a frequency obtained by multiplication of said reference frequency; means for discriminating the sign of the frequency error and means for generating a current proportional to said frequency difference and whose direction is a function of said sign.

10. The oscillator as claimed in claim 2, wherein said resonator works in reflection mode and is loaded at one end by a negative reactance and, at the other end, by a purely reactive load.

* * * * *